(12) United States Patent
Miyachi et al.

(10) Patent No.: US 7,510,898 B2
(45) Date of Patent: Mar. 31, 2009

(54) METHOD OF MANUFACTURING IMAGE DISPLAY DEVICE AND METHOD OF DIVIDING DEVICE

(75) Inventors: Takeshi Miyachi, Utsunomiya (JP); Masaaki Furuya, Yokohama (JP)

(73) Assignees: Canon Kabushiki Kaisha, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/749,310

(22) Filed: May 16, 2007

(65) Prior Publication Data

US 2007/0275493 A1 Nov. 29, 2007

(30) Foreign Application Priority Data

May 25, 2006 (JP) ............................. 2006-145174
May 14, 2007 (JP) ............................. 2007-128246

(51) Int. Cl.
*H01L 21/00* (2006.01)
(52) U.S. Cl. .......................................... 438/57; 438/33
(58) Field of Classification Search ................... 438/30, 438/33, 57, 68
See application file for complete search history.

(56) References Cited

U.S. PATENT DOCUMENTS

| 5,844,304 | A  | * | 12/1998 | Kata et al. ................. 257/620 |
| 6,236,446 | B1 |   | 5/2001  | Izumi et al. ................. 349/187 |
| RE39,603  | E  | * | 5/2007  | Kata et al. ................. 257/620 |
| 7,354,801 | B2 | * | 4/2008  | Sugiyama et al. ........... 438/113 |
| 2003/0224540 | A1 | * | 12/2003 | Watanabe et al. .............. 438/7 |
| 2004/0128829 | A1 | * | 7/2004 | Kimura ........................ 29/832 |
| 2004/0137723 | A1 | * | 7/2004 | Noma et al. ................. 438/667 |
| 2005/0061123 | A1 | * | 3/2005 | Park .............................. 83/13 |
| 2005/0130390 | A1 | * | 6/2005 | Andrews et al. ............ 438/458 |
| 2005/0253237 | A1 | * | 11/2005 | Corisis ....................... 257/678 |
| 2005/0272224 | A1 | * | 12/2005 | Ueda et al. ................. 438/460 |
| 2006/0046435 | A1 |   | 3/2006 | Kida ........................... 438/460 |
| 2006/0063309 | A1 | * | 3/2006 | Sugiyama et al. ........... 438/118 |
| 2006/0205182 | A1 | * | 9/2006 | Soejima ...................... 438/460 |
| 2008/0093708 | A1 | * | 4/2008 | Noma et al. ................. 257/620 |
| 2008/0113494 | A1 | * | 5/2008 | Kida ........................... 438/463 |

FOREIGN PATENT DOCUMENTS

| CN | 1601339 A | 3/2005 |
| CN | 1744284 A | 3/2006 |
| JP | 11-160667 | 6/1999 |

* cited by examiner

*Primary Examiner*—Thao p. Le
(74) *Attorney, Agent, or Firm*—Fitzpatrick, Cella, Harper & Scinto

(57) ABSTRACT

A manufacturing method of manufacturing an image display device having a wiring and a display element electrically connected to the wiring, comprising a step of dividing a device having the wiring and a substrate holding the wiring, at a predetermined division position, wherein the dividing step comprises a step of dividing the substrate at the predetermined division position and a step of dividing the wiring at the predetermined division position. The step of dividing the wiring is executed in a method different from a method in the step of dividing the substrate. Thus, the device constituting the image display device can be suitably divided.

8 Claims, 12 Drawing Sheets

METHOD OF MANUFACTURING IMAGE DISPLAY DEVICE AND METHOD OF DIVIDING DEVICE

BACKGROUND OF THE INVENTION

1. Field of the Invention

The present invention relates to a method of manufacturing an image display device having a wiring and a display element connected to the wiring, and a method of dividing a device.

2. Description of the Related Art

Japanese Patent Application Laid-Open No. H11-0160667 (corresponding to U.S. Pat. No. 6,236,446) discloses a technique for cutting a substrate of a liquid crystal display device.

That is, a technique for precisely and effectively dividing (or cutting) a device having a wiring and a substrate holding the wiring is desired.

In a conventional scribing method, if it is intended to divide the wiring in the same process as that for dividing the substrate, there is a fear that undivided wirings remain.

Further, if a constitution for dividing the wiring in the same process as that for dividing the substrate is adopted, limitations for a manufacturing method, materials, shapes and the like of the wiring are serious. Furthermore, there is a fear that the shape of the edge surface formed by dividing the wiring is distorted.

SUMMARY OF THE INVENTION

In consideration of such conventional problems as described above, the present invention aims to provide a method of manufacturing an image display device capable of precisely and effectively dividing a device having a wiring and a substrate for holding the wiring, and a method of dividing a device.

To achieve this, one aspect of the present invention is characterized by a method of manufacturing an image display device having a wiring and a display element electrically connected to the wiring, comprising a step of dividing a device having the wiring and a substrate holding the wiring, at a predetermined division position, wherein the dividing step further comprises a step of dividing the substrate at the predetermined division position, and a step of dividing the wiring at the predetermined division position, and wherein the step of dividing the wiring is executed in a method different from a method in the step of dividing the substrate.

According to the present invention, it is possible to select the suitable step with respect to each of division of the substrate and division of the wiring. Then, if the suitable steps are adopted respectively, it is possible to suitably divide the substrate and the wiring.

Further features of the present invention will become apparent from the following description of exemplary embodiments with reference to the attached drawings.

DESCRIPTION OF THE EXEMPLARY EMBODIMENTS

The inventor of the present invention developed a technique for dividing a device having a wiring and a substrate holding the wiring. Further, the inventor examined the relevant technique by using the substrate formed by a brittle material such as a glass substrate, a ceramics substrate or the like.

As a result of such examination, it turned out that, in a conventionally known scribing method, an undivided wiring (that is, a wiring which has not been divided completely) may remain.

In particular, it turned out that it is difficult to satisfactorily divide the device if either the condition (1) that the wiring held on the substrate was formed by sputtering or plating or the condition (2) that the thickness of the wiring is 1 μm or more at the division position is satisfied.

With respect to the substrate formed by the brittle material, for example, if a step of applying a stress to the substrate is executed after a step of forming cracks or grooves on the substrate, the substrate can be divided at the positions where the cracks or the grooves were formed. However, with respect to the wiring which satisfies either the above condition (1) or (2), it is difficult to divide the relevant wiring on the substrate together with the substrate.

Such a problem, which occurs if the wiring satisfies either the above condition (1) or (2), is particularly noteworthy if the wiring satisfies both the above conditions (1) and (2). That is, it is extremely difficult to divide the wiring formed by plating or sputtering and having the thickness of 1 μm or more, concurrently with the substrate on which the relevant wiring has been formed. Incidentally, if a grinding process is used, it is possible to grind and thus divide the substrate and the wiring in the same grinding process. However, a processing time in the grinding process is generally long, in a case where both of the substrate and the wiring are divided by only the grinding process. On the other hand, the scribing method in which a crack is formed in a substrate by using a cutter or laser heating and thus the substrate is divided is preferable because a processing time is short.

Further, it turned out that, if the wiring includes any one of Cu, Al, Au, Ag, Pt, Cr, Ni and Pd, it is particularly difficult to divide the wiring in the same process as that for dividing the substrate.

Hereinafter, such a specific problem as described above, found as a result of the repetitive examinations by the inventor, will be concretely described.

Figure 14A:
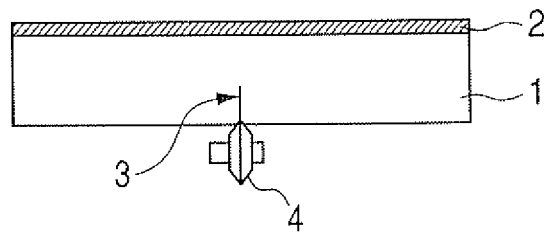
FIGS. 14A, 14B and 14C are schematic cross section diagrams for describing a problem in a conventional dividing method.
Figure 14B:
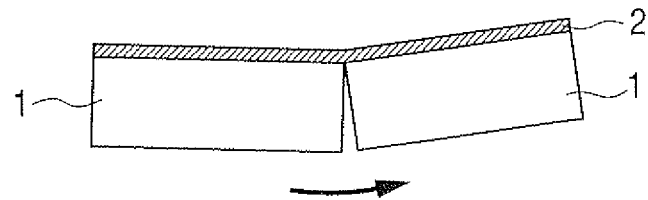
Figure 14C:
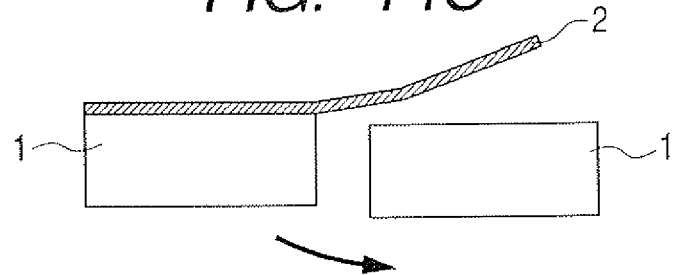

FIGS. 14A to 14C are schematic cross section diagrams for describing the problem as described above. As illustrated in FIG. 14A, the cutting edge of a cutter wheel 4 is applied on the rear surface of a brittle-material substrate 1 (simply called a substrate 1 hereinafter) to form a vertical crack 3 in a direction parallel to the thickness direction of the substrate 1. In the following, such a process of relatively moving, as bringing the cutting edge into contact with the substrate, the cutting edge and the substrate along the position at which the crack is formed will be also called a scribing step. Incidentally, it should be noted that a constitution for, while fixing the substrate, moving the cutting edge in relation to the substrate is preferably adopted as the constitution for relatively moving the cutting edge and the substrate. FIG. 14B illustrates a step of inclining one side of the substrate 1 as centering the vertical crack 3, and thus breaking the substrate 1 as fulcruming the vertical crack 3. In the following, such a step of forming the crack which does not yet divide the substrate and then ending the process will be also called a break step. Namely, by the break step, the substrate 1 is divided into two as centering the vertical crack 3.

At that time, a wiring 2 which satisfies either the above condition (1) or (2) (or both the above conditions (1) and (2)) is hard to be divided concurrently with the division of the substrate 1. Thus, if the substrate 1 is divided but the wiring is not divided, the device is defective as a whole.

Here, if it is assumed that the wiring 2 was formed by patterning and baking a silver paste, the wiring 2 and the substrate 1 can be comparatively effectively divided together in the same process even if the thickness of the wiring 2 is 1 µm or more. Probably, this is because the wiring formed by patterning and baking the silver paste has the constitution that particles of silver are combined together by a binder, and brittleness in the constitution of this type is high.

On the other hand, the film density of the wiring formed by plating or sputtering is comparatively high, and the ductility thereof is comparatively high, whereby it is conceivable that the relevant wiring is hard to be divided concurrently with the substrate.

Moreover, even if the thickness of the wiring is less than 1 µm, it is possible to comparatively effectively divide the substrate and the wiring in the same step.

However, if the thickness of the wiring is 1 µm or more, it turned out that it is difficult to divide the wiring in the same process as that of dividing the substrate.

Moreover, even if it is possible to comparatively effectively divide the substrate and the wiring in the same step, there is a fear that the shape of the edge surface formed by the division of the wiring is distorted.

In recent years, in a device such as an image display device which uses an electron emission element as a display element, a constitution that a large-scale current flows on the wirings is desired. In order to cope with such a request, the inventor of the present invention studied and examined a mechanism for reducing a resistance on the wiring, and examined a device particularly having a wiring of which the thickness exceeds 1 µm. As a result, it turned out that, if it is intended to divide the substrate and the wiring in the same step, effectiveness of the division tends to deteriorate and the shape of the edge surface formed by dividing the wiring tends to be distorted.

If the broken two substrates are separated in the state that the wiring is not yet divided, as illustrated in FIG. 14C, the wiring 2 is detached (or peeled) from the substrate 1.

In the present invention, a dividing step of dividing the wiring 2 is executed in a method different from the dividing step of dividing the substrate 1. Incidentally, it should be noted that only one or plural parts from among plural parts acquired by dividing the device is used (each of the parts acquired by the division is also called a divided device), and the remaining parts can be discarded. Also, each of all the remaining parts acquired by the division can be used in subsequent steps. Further, equipment having a desired function can be manufactured or assembled by using the divided device as parts. For example, an image display can be assembled by using the divided device as parts.

Although the thickness of the wiring and the conditions in the wiring manufacturing method are cited in the above description as the factors for particularly making the division difficult, it turned out that the range to which the present invention is applicable is not limited to them. More specifically, even in case of satisfying the condition by which the division can comparatively effectively be executed (for example, the thickness of the wiring is less than 1 µm), the shape of the edge surface formed by dividing the wiring may be distorted. One of the effects of the present invention is that the shape of the edge surface of the wiring is hard to be distorted, and this effect can be achieved even if the thickness of the wiring is less than 1 µm and even if the wiring is formed by patterning and baking the silver paste.

In the following, examples of the present invention will be described concretely with reference to the attached drawings.

FIRST EXAMPLE

FIGS. 1A to 1G are schematic cross section diagrams for describing a dividing (separating) step. Hereinafter, the dividing method according to the first example will be described with reference to FIGS. 1A to 1G.

Initially, a cutting edge of a cutter wheel 4 is brought into contact with a predetermined division position on the rear surface of a substrate 1 on which a wiring 2 has been formed (that is, the surface opposed to the surface on which the wiring 2 to be divided has been held). Here, it should be noted that the wiring 2 and the substrate 1 together constitute the device before the division is executed. Thus, a vertical crack 3 is formed. Here, it should be noted that carbide or diamond is desirable as the cutting edge of the cutter wheel 4.

Figure 1A:
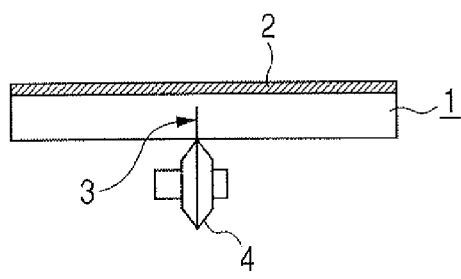
FIGS. 1A, 1B, 1C, 1D, 1E, 1F and 1G are schematic cross section diagrams for describing a dividing method according to a first example.

As illustrated in FIG. 1A, at the stage that the vertical crack 3 is formed on the substrate 1, the vertical crack 3 only reaches on the way in the thickness direction of the substrate 1, whereby the substrate 1 is not yet divided completely.

Figure 1B:
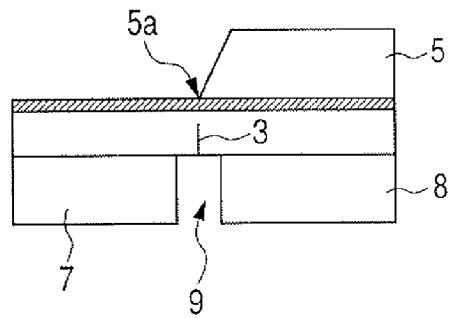

Then, as illustrated in FIG. 1B, the substrate 1 on which the vertical crack 3 has been formed is fixed so as to straddle on a pair of a rear surface fixing platform A 7 and a rear surface fixing platform B 8. Here, although a vacuum chuck is used to fix the substrate 1 in the first example, it is also possible to mechanically fix the substrate 1. Subsequently, a pressure plate 5 having a sharp edge portion 5a is positioned on the scribe line (cut line) along which the vertical crack 3 has been formed, and the substrate 1 is nipped and fixed by the rear surface fixing platform B 8 and the pressure plate 5. Thus, since the substrate 1 is nipped between the rear surface fixing platform B 8 and the pressure plate 5, the wiring 2 is pressed toward the substrate 1, whereby it is also possible to achieve an effect of preventing the wiring 2 from being separated from the substrate 1 in the subsequent dividing steps. Incidentally, the pressure plate 5 is disposed so that the position of the sharp edge portion 5*a* is slightly shifted in parallel with the scribe line and toward the outside of the substrate 1 from the position (immediately above the scribe line) where the vertical crack 3 has been formed.

An interval (or gap) 9 between the rear surface fixing platform A 7 and the rear surface fixing platform B 8 forms a space for discharging particles and gallets produced in the break step of breaking the substrate 1.

Figure 1C:
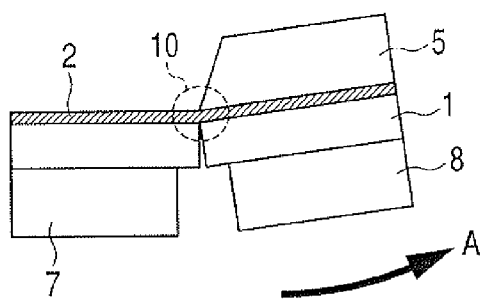
Figure 1D:
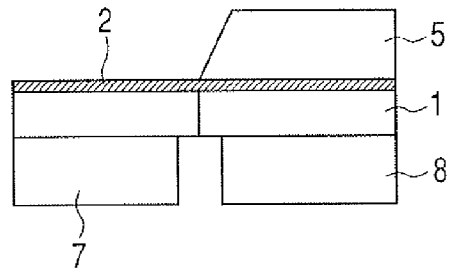

Next, as illustrated in FIG. 1C, the rear surface fixing platform B8 and the pressure plate 5 having the sharp edge portion 5*a* both located on the right side of FIG. 1C are rotated from the rear surface fixing platform A7 in the direction indicated by an arrow A by using the wiring 2 on the scribe line as a fulcrum 10, thereby applying force to the division position. By such a step, the substrate 1 is broken(divided) into two substrates. It should be noted that a series of processes up to now is the scribing step and the break step both constituting the substrate dividing method (scribing method). However, the wiring 2 on the substrate 1 is not yet divided by the processes up to now. Subsequently, as illustrated in FIG. 1D, the rear surface fixing platform B8 and the pressure plate 5 rotated as above are returned to the original state substantially horizontal.

Figure 1E:
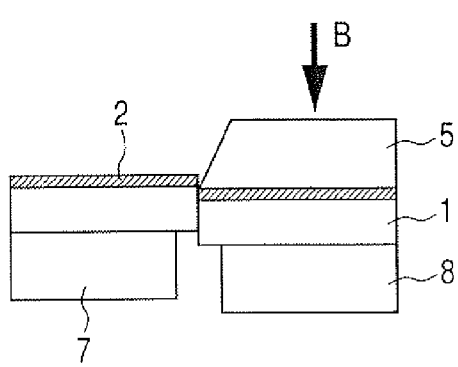

Next, as illustrated in FIG. 1E, the rear surface fixing platform B 8 and the pressure plate 5 having the sharp edge portion 5*a* both located on the right side of FIG. 1E are moved in the direction indicated by an arrow B being in parallel with the thickness direction of the substrate 1. Then, since the pressure plate 5 is moved in the direction B, shearing force is applied to the wiring 2 on the substrate 1 by means of the sharp edge portion 5*a*. By such a step, the force for dividing the wiring at the division position is applied, whereby the wiring 2 is actually divided.

Although the wiring is not yet divided in the scribing method, it is possible to divide the wiring 2 by adopting a method different from the scribing method and more suitable for the division of the wiring.

Incidentally, when the substrate is divided by executing the scribing step, a crack may be formed on the wiring to an extent by which the wiring is not divided. In this case, the wiring on which the relevant crack has been formed is divided. In this case, the step of dividing the wiring is made by combining mainly a shearing step and a supplementally functioning scribing step. This combination is different from the substrate dividing step made by a combination of the scribing step and the break step or made by only the scribing step. Further, at the time when the scribing step is executed, a slight uncut residual exists at the position where the substrate was divided, and the substrate may be completely divided in the later-executed wiring dividing step. In this case, the step of dividing the substrate is made by combining mainly the scribing step and the supplementally functioning shearing step. This combination is different from the wiring dividing step made by only the shearing.

Incidentally, a distance of the movement as illustrated in FIG. 1E may be a distance by which the wiring pattern is sheared. More specifically, the relevant distance may be set within a range of several microns to one millimeter or so, according to mechanical accuracy of a divider, dimensional accuracy of the pressure plate 5 and viscosity of the wiring pattern.

Figure 1F:
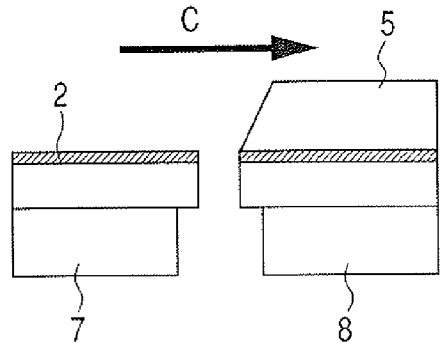
Figure 1G:
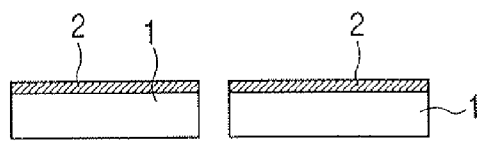

Subsequently, as illustrated in FIG. 1F, one of the devices acquired by dividing the substrate 1 is moved with respect to the other device in the direction indicated by an arrow C, thereby separating the divided devices from each other. At the last, step as illustrated in FIG. 1G, the rear surface fixing platforms A 7 and B8 and the pressure plate 5 are removed from the respective divided devices.

In the first example, a copper plating wiring of which the thickness is 20 μm is used as the wiring. Here, any one of chemical plating and electric field plating can be adopted as the plating. Further, it is preferable to set the thickness of the wiring at the division position to be 1000 μm or less.

Figure 2A:
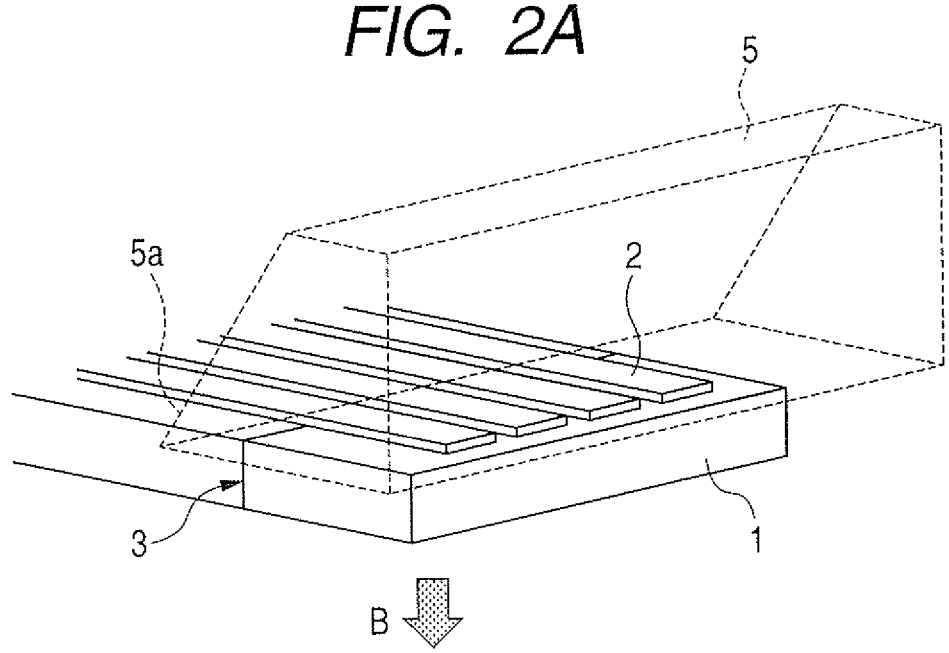
FIGS. 2A and 2B are perspective views illustrating a state that the wiring illustrated in FIG. 1A is divided.
Figure 2B:
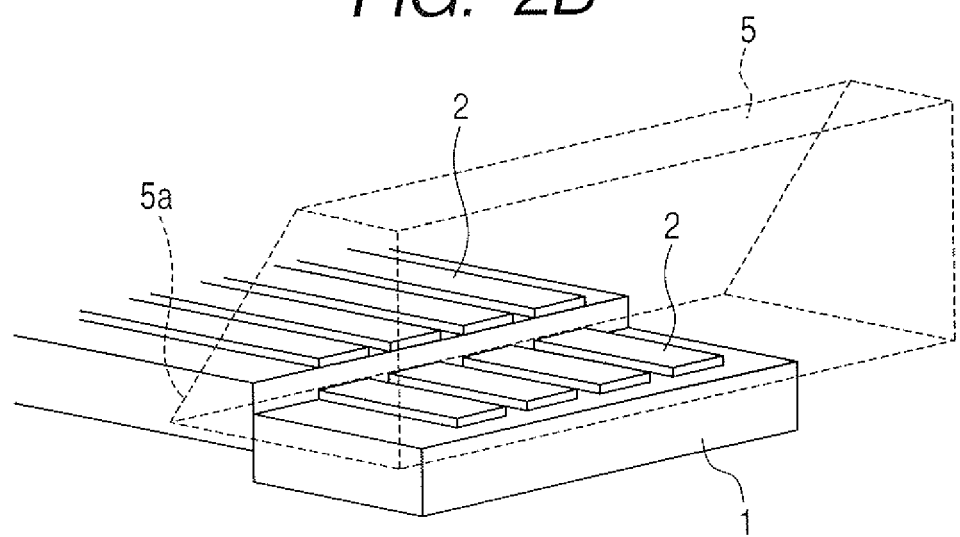

FIGS. 2A and 2B are perspective views illustrating a state that the wiring 2 is divided by the pressure plate 5 having the sharp edge portion 5*a*. More specifically, FIGS. 2A and 2B illustrate the state that the scribing step and the break step for the substrate 1 have ended. Then, the pressure plate 5 acting as the member for applying force to divide the wiring 2 is moved so that such division force is applied to the wiring 2. Thus, as illustrated in FIG. 2B, the wiring 2 on the substrate 1 is divided. Here, the pressure plate 5 may be moved relatively. That is, instead of the operation that the pressure plate 5 is moved in the direction indicated by the arrow B, the rear surface fixing platform A 7 may be moved in the direction opposed to the direction indicated by the arrow B so as to divide the wiring 2. In other words, it is possible to adopt various operations if the force for dividing the wiring 2 can be applied.

Here, although the device in which the wiring 2 is held on the flat surface of the substrate 1 is divided in the first example, the first example may be applied to the constitution that the wiring has been embedded on the surface of the substrate 1.

Figure 3A:
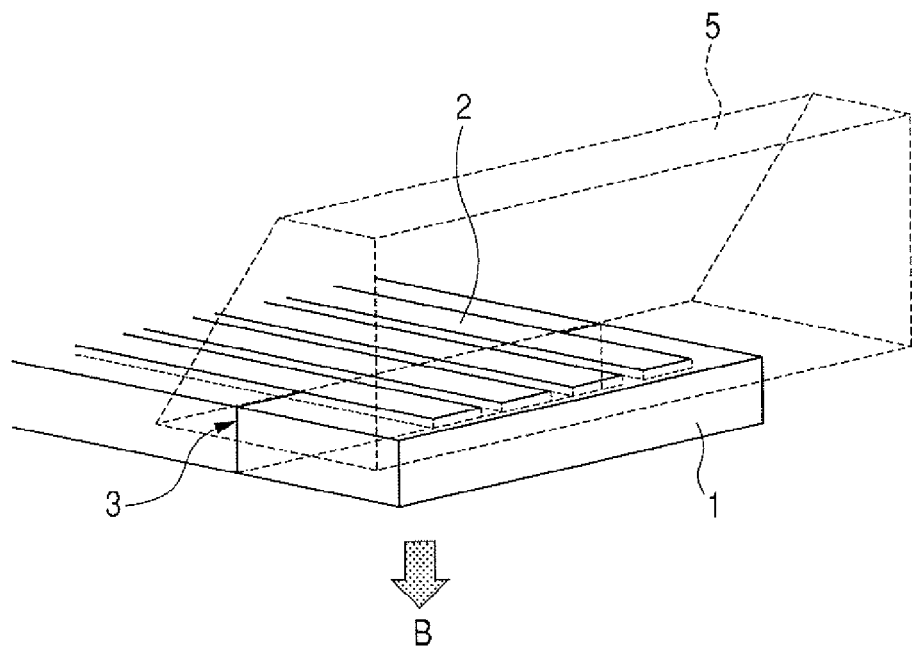
FIGS. 3A and 3B are perspective views illustrating a state that a substrate in which a wiring pattern has been embedded is divided.
Figure 3B:
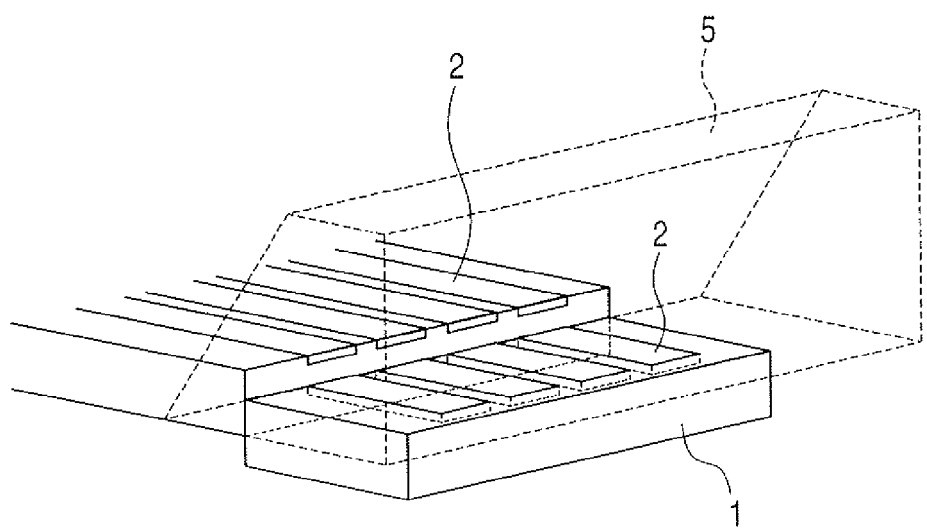

FIGS. 3A and 3B are perspective views illustrating the device in which the wiring 2 has been embedded on the surface of the substrate 1. That is, the relevant device can be divided in the same dividing step as illustrated in FIGS. 1A to 1G.

Figure 4A:
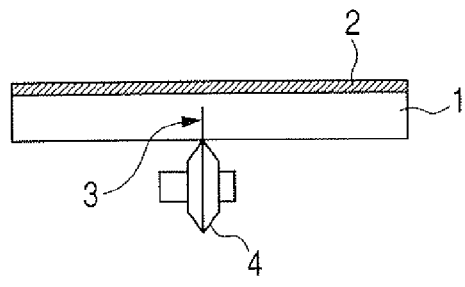
FIGS. 4A, 4B, 4C, 4D, 4E, 4F and 4G are schematic cross section diagrams for describing a dividing method according to another example.
Figure 4B:
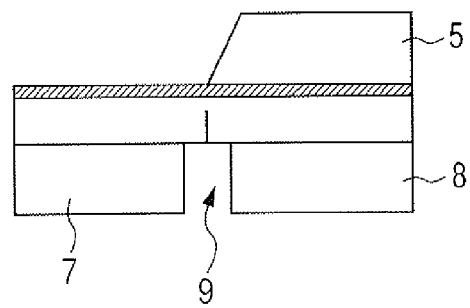
Figure 4C:
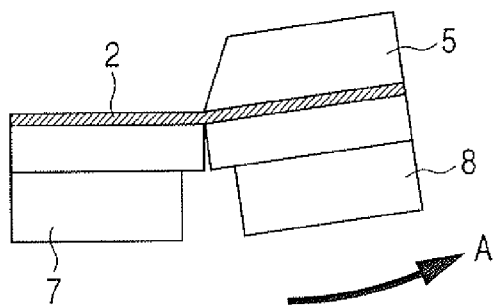

FIGS. 4A to 4G are schematic cross section diagrams for describing a dividing method according to another example. Here, it should be noted that the step of forming the vertical crack illustrated in FIG. 4A, the step of fixing the substrate 1 to the respective rear surface fixing platforms A 7 and B 8 illustrated in FIG. 4B, and the step of breaking the substrate 1 illustrated in FIG. 4C are the same as the respective steps illustrated in FIGS. 1A to 1C, whereby the description thereof will be omitted.

Figure 4D:
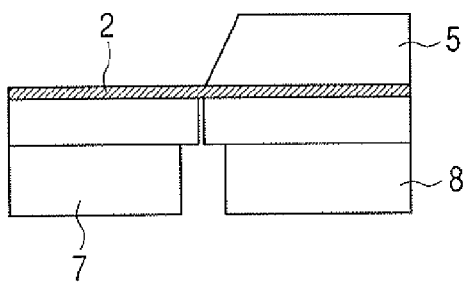

Then, in the step illustrated in FIG. 4D, an interval is secured along the break line by slightly pulling one side (right side in FIG. 4D) of the broken two substrates 1 in the direction parallel with the surface of the substrate. An amount of the interval may be an amount by which a wiring material can be slightly extended.

Subsequently, in the step illustrated in FIG. 4E, the (right) rear surface fixing platform B 8 and the pressure plate 5 are moved in the direction indicated by the arrow B, thereby dividing the wiring 2.

Here, a distance of the vertical movement may be a distance by which the wiring pattern can be sheared. More specifically, the relevant distance may be set within a range of several microns to one millimeter, according to mechanical accuracy of a divider, accuracy of the sharp pressure plate and viscosity of the wiring pattern.

Figure 4E:
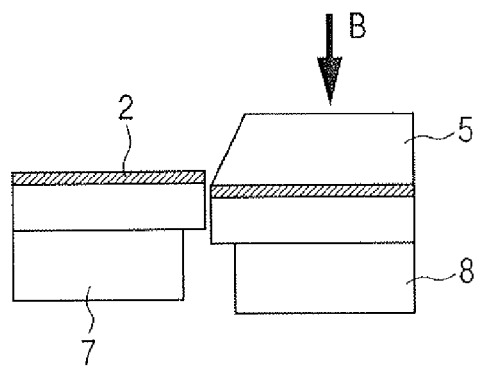
Figure 4F:
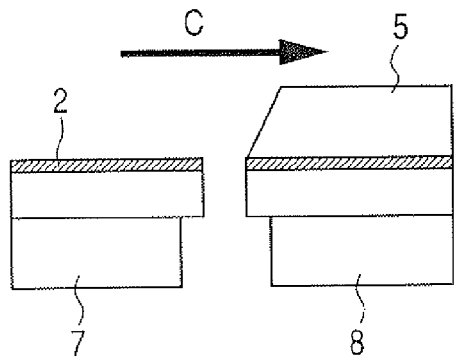

Subsequently, as illustrated in FIG. 4F, the rear surface fixing platform B 8 is moved as opposed to the rear surface fixing platform A 7 in the direction indicated by the arrow C, thereby separating the divided substrates 1 from each other.

Figure 4G:
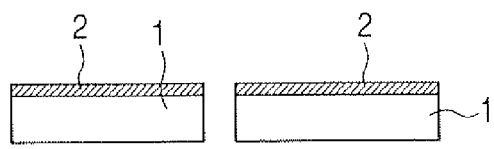

Then, after the division of the substrate 1 ended, as illustrated in FIG. 4G, the rear surface fixing platforms A 7 and B 8 and the pressure plate 5 are removed respectively.

In this method, since the edge surfaces of the divided substrates 1 have been separated from each other in the step illustrated in FIG. 4D, it is possible to prevent that the edge surfaces of the divided substrates 1 are scraped mutually in the step of dividing the wiring 2 illustrated in FIG. 4E. For this reason, it is possible to prevent that cullets such as chippings and the like are generated.

Figure 5A:
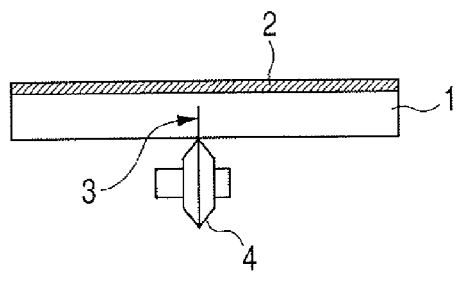
FIGS. 5A, 5B, 5C, 5D, 5E, 5F and 5G are schematic cross section diagrams for describing a dividing method according to further another example.
Figure 5B:
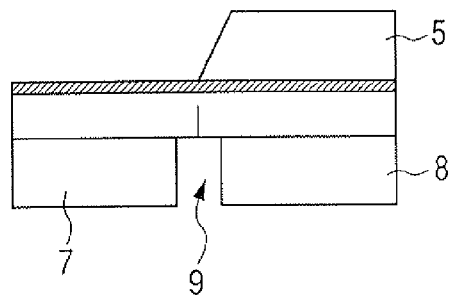
Figure 5C:
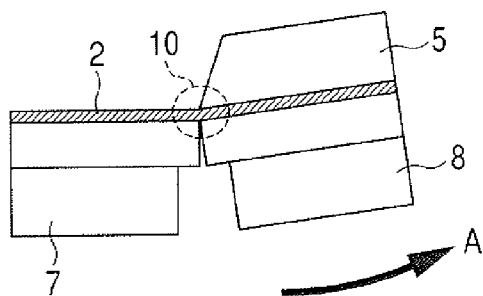

FIGS. 5A to 5G are schematic cross section diagrams for describing a dividing method according to another further example. Here, it should be noted that the steps illustrated in FIGS. 5A to 5C are the same as the respective steps illustrated in FIGS. 1A to 1C and FIGS. 2A to 2C, whereby the description thereof will be omitted.

Figure 5D:
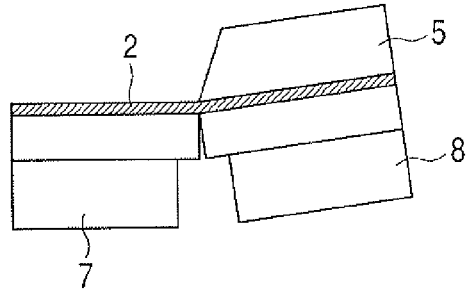

FIG. 5D illustrates a state immediately before the wiring is divided. In this state, the portions of the wiring 2 on both the sides nipping the division position on the subscribe line of the substrate 1 are slightly rotated and inclined as centering the fulcrum 10. At this time, the inclination may be slight, and an inclined angle may be larger than 0°.

Figure 5E:
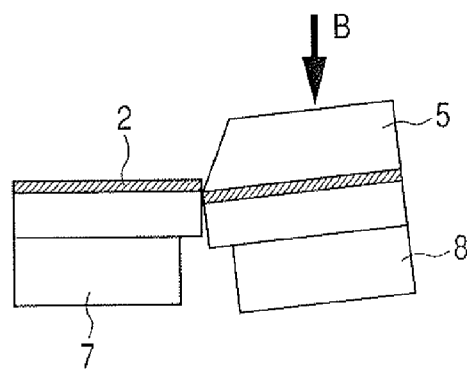

Then, in the step illustrated in FIG. 5E, the rear surface fixing platform B8 and the pressure plate 5 on the side inclined (right in FIG. 5E) are moved in the direction indicated by the arrow B from the state that the wiring 2 is inclined as centering the fulcrum 10. Here, a distance of the movement may be a distance by which the wiring 2 can be sheared. More specifically, the relevant distance may be set within a range of several microns to one millimeter, according to mechanical accuracy, dimensional accuracy of the pressure plate 5 and viscosity of the wiring pattern.

Figure 5F:
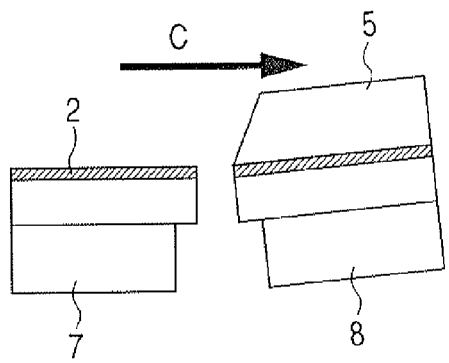
Figure 5G:
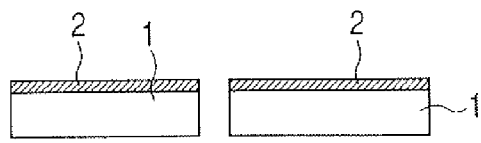

Subsequently, as well as in the above examples, as illustrated in FIG. 5F, one of the devices acquired by dividing the substrate 1 is moved as opposed to the other device in the direction indicated by the arrow C, thereby separating the divided devices from each other. At the last step, as illustrated in FIG. 5G, the rear surface fixing platforms A 7 and B 8 and the pressure plate 5 are removed respectively.

In this method, the portions on both the sides nipping the division position of the substrate 1 are inclined respectively, and the wiring 2 is divided in the state that the edge surfaces of the divided substrates 1 are mutually separated from each other. Thus, according to this step, it is possible to prevent that the edge surfaces of the divided substrates 1 are scraped mutually in case of dividing the wiring 2, whereby it is possible to prevent that cullets such as chippings and the like are generated.

Figure 6A:
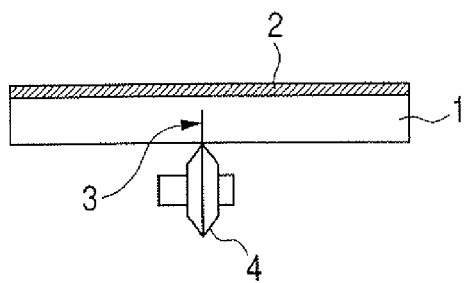
FIGS. 6A, 6B, 6C, 6D, 6E, 6F and 6G are schematic cross section diagrams for describing a dividing method according to further another example in which another pressure plate is added on a substrate.
Figure 6B:
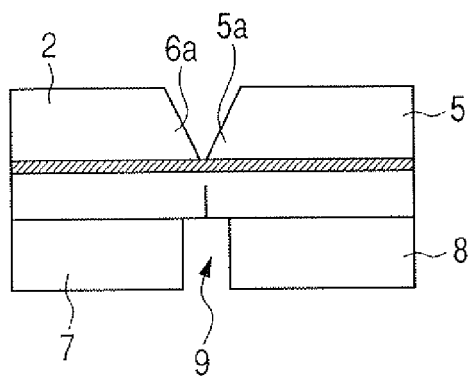

FIGS. 6A to 6G are schematic cross section diagrams for describing a dividing method according to another further example in which another pressure plate is added on the substrate. More specifically, FIG. 6A illustrates a step of forming a vertical crack as well as in the step illustrated in FIG. 1A. Then, in a step illustrated in FIG. 6B, a pressure plate 6 having a sharp edge portion 6a is disposed at the position opposed to the pressure plate 5 having the sharp edge portion 5a. Moreover, the pressure plate 6 is fixed so as to nip the substrate 1 in cooperation with the rear surface fixing platform A7.

Figure 6C:
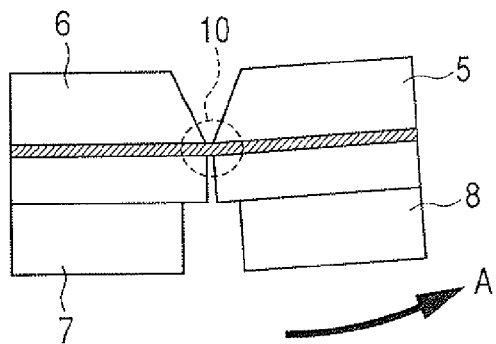
Figure 6D:
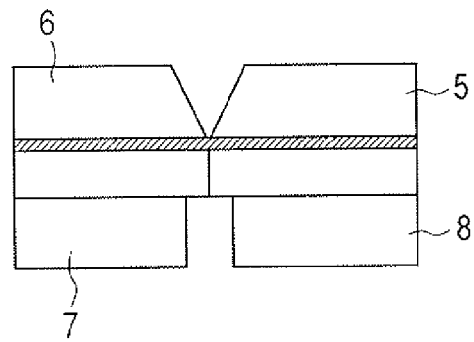
Figure 6E:
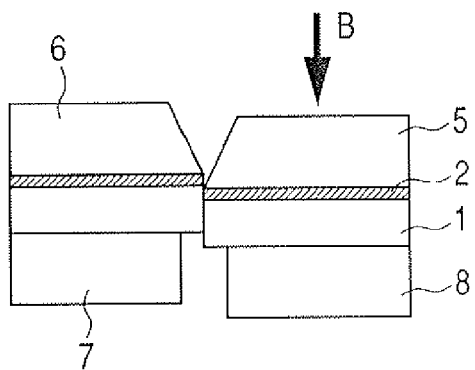
Figure 6F:
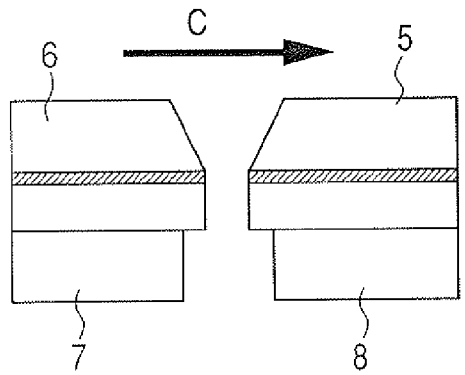
Figure 6G:
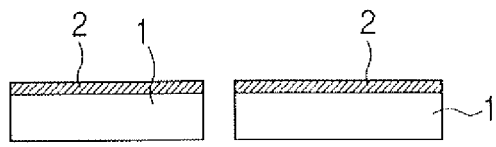

Subsequently, as well as in the steps illustrated in FIGS. 1C to 1E, a step of dividing the substrate 1 and a step of dividing the wiring 2 are executed in the state that the wiring 2 is being pressed by a pair of the pressure plates 5 and 6, as illustrated in FIGS. 6C to 6E. Since the wiring 2 is divided in the state that the pressure force for maintaining the contact state of the wiring 2 and the substrate 1 is being applied on both the sides nipping the division position of the substrate 1, it is further possible to restrain the wiring 2 from being separated from the substrate 1.

Here, it should be noted that, even in each of the device dividing steps respectively illustrated in FIGS. 4A to 4E and FIGS. 5A to 5E, it is possible to divide the wiring 2 in the state that the pressure plates for pressing the wiring 2 are disposed on both the sides nipping the division position of the substrate 1. For this reason, it is possible to further restrain inconvenience due to separation of the wiring, thereby increasing process yield.

Figure 7A:
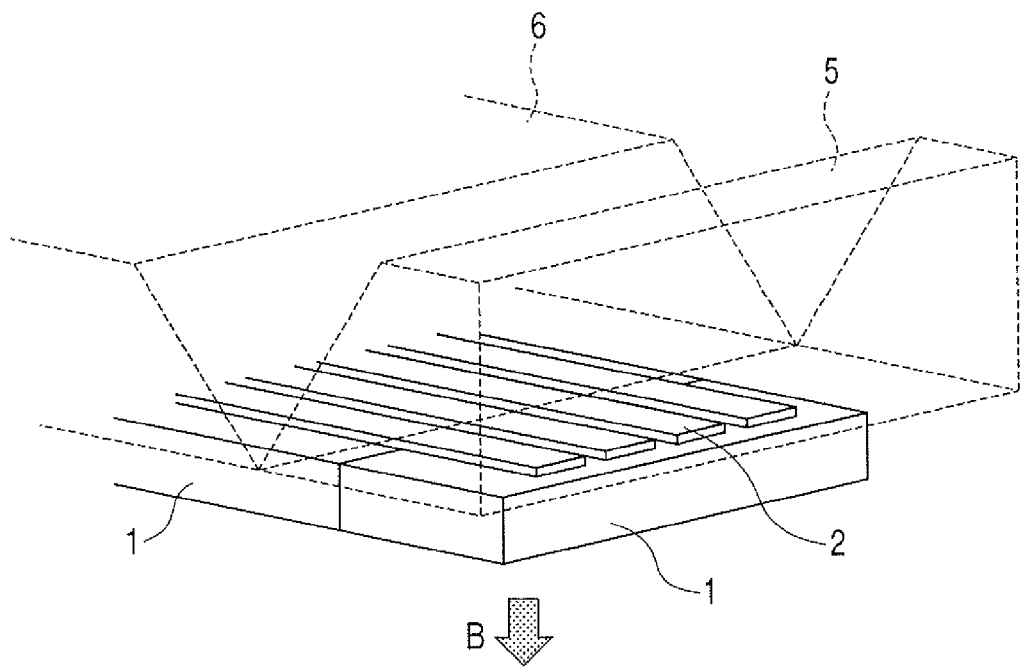
FIGS. 7A and 7B are perspective views illustrating a state that the wiring illustrated in FIG. 6A is divided.
Figure 7B:
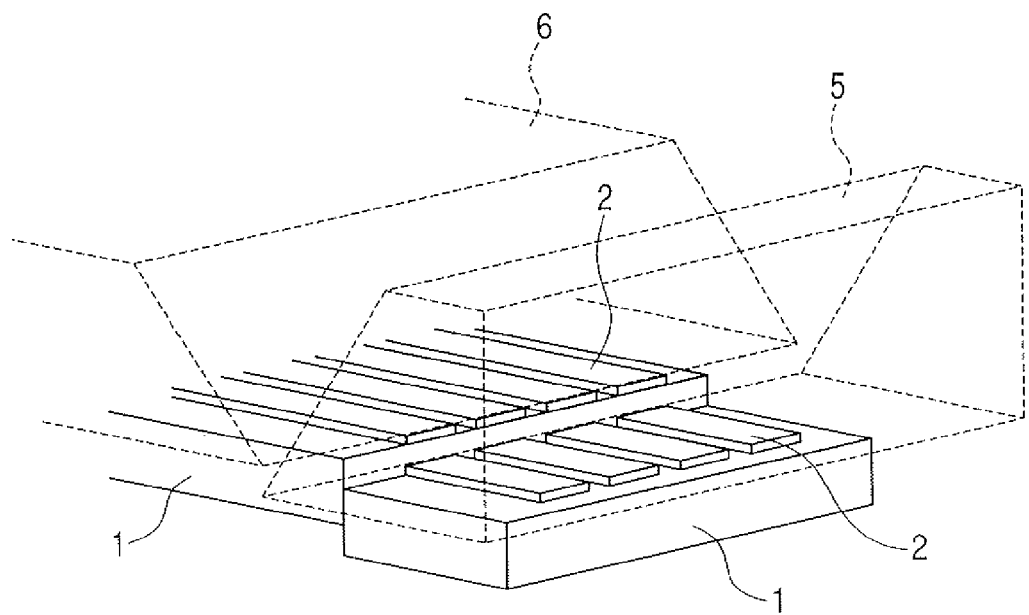
Figure 8A:
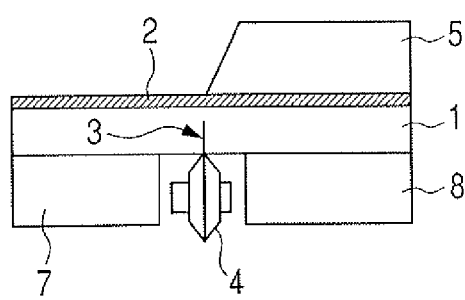
FIGS. 8A, 8B, 8C, 8D, 8E and 8F are schematic cross section diagrams for describing a dividing method in which a processing device including a dividing mechanism and a cutting edge scribing mechanism is used.
Figure 8B:
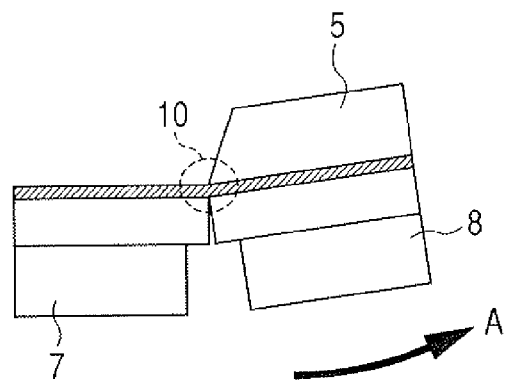
Figure 8C:
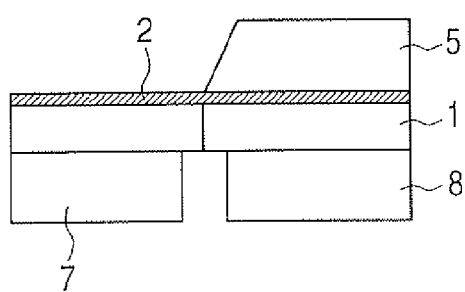
Figure 8D:
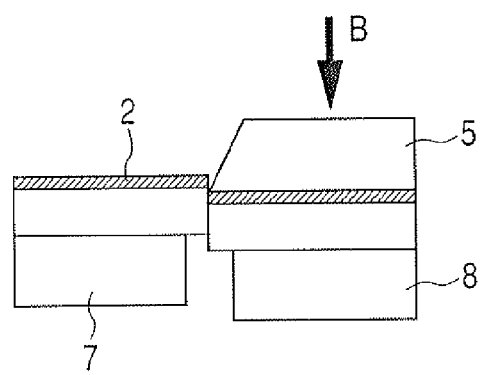
Figure 8E:
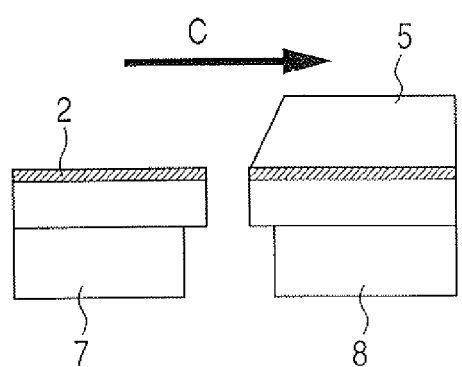
Figure 8F:
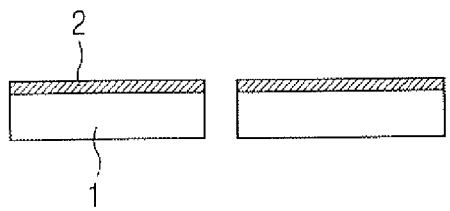

FIGS. 7A and 7B are perspective views illustrating a step of dividing the wiring by using a pair of the pressure plates 5 and 6. Incidentally, it should be noted that, even if the device in which the wiring has been embedded on the substrate is used, it is possible to achieve the same effect as described above.

FIGS. 8A to 8F are schematic cross section diagrams for describing a dividing method in which a processing device including a dividing mechanism and a cutting edge scribing mechanism is used, according to another example. That is, in a step illustrated in FIG. 8A, the substrate 1 on which the wiring 2 has been formed is previously fixed by the rear surface fixing platform A 7, the rear surface fixing platform B 8 and the pressure plate 5 having the sharp edge portion 5a. Then, in this state, the vertical crack 3 is formed from the rear surface of the substrate 1 by using the cutting edge of the cutter wheel 4.

Here, it should be noted that the steps illustrated in FIGS. 8B to 8E are the same as the respective steps illustrated in FIGS. 1C to 1F, whereby the description thereof will be omitted. In this example, the step of fixing the substrate 1 and the step of forming the vertical crack 3 are executed by an identical processing device, whereby it is possible to easily execute relative positioning of the scribe line formed on the substrate 1 and the sharp edge portion 5a of the pressure plate 5. Therefore, according to this example, it is possible to divide the substrate 1 and the wiring 2 with a higher degree of accuracy.

Moreover, in the step of forming the vertical crack 3 on the substrate 1, a laser beam, instead of the cutting edge of the cutter wheel 4, may be used to achieve the same effect. That is, it is possible to suitably adopt a method of generating a heat stress by irradiating the laser beam and thus forming the vertical crack 3.

Figure 9A:
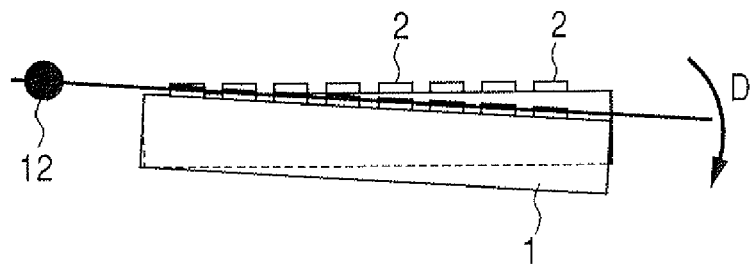
FIGS. 9A, 9B and 9C are perspective views for describing a state that, as one end of a scribe line is made a fulcrum, dividing force is applied from the other end thereof.
Figure 9B:
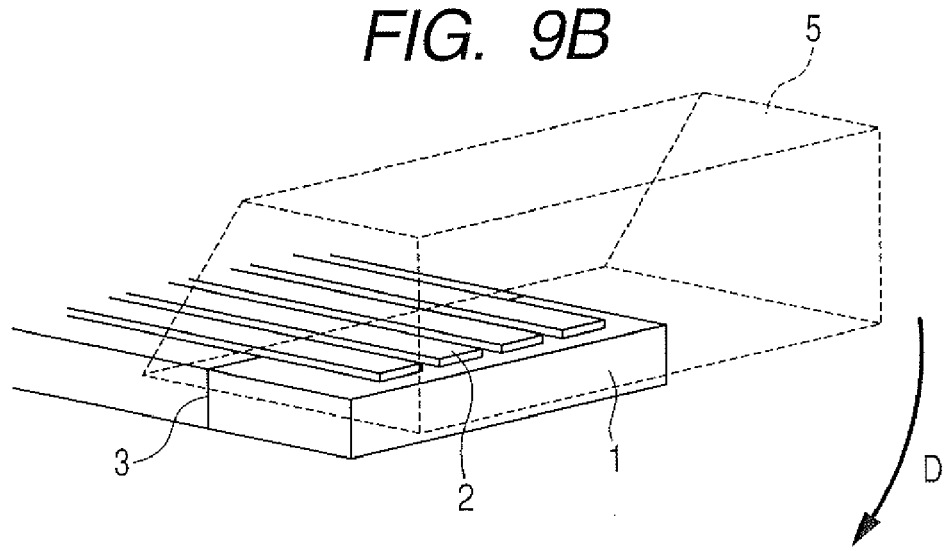
Figure 9C:
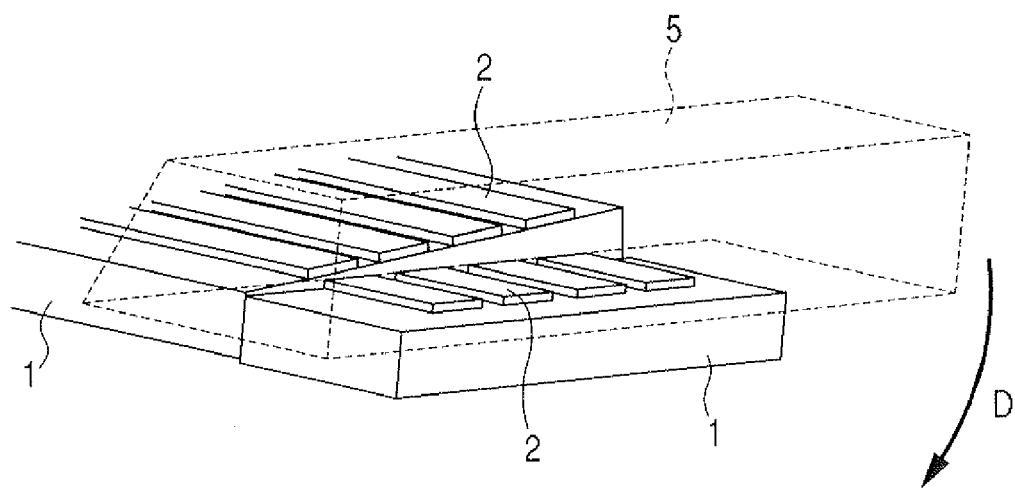

FIGS. 9A to 9C are perspective views for describing another further example. FIG. 9A is the side view in the direction opposed to the divided edge surface of the substrate. As illustrated in FIG. 9A, the pressure plate 5 having the sharp edge portion 5a is rotated in the direction indicated by an arrow D, as one end of the scribe line is made a fulcrum 12, so as to rotate the other peripheral end of the substrate 1 in the direction indicated by the arrow D, thereby dividing the wiring 2 on the substrate 1. By dividing the wiring 2 in such a manner, the plural wirings 2 constituting the wiring pattern are sequentially divided from the side of one end of the scribe line to the side of the other end thereof. FIG. 9B is the perspective diagram illustrating the state before the wiring is divided, and FIG. 9C is the perspective diagram illustrating the state after the wiring was divided. It should be noted that, if the dividing step as illustrated in FIGS. 9A to 9C is used, it is possible to simplify the dividing mechanism for dividing the substrate.

In the above, various examples of the method of dividing the device having the wiring and the substrate holding the relevant wiring thereon and the division device using the relevant dividing step are described.

Incidentally, in the above description, the method including the scribing step and the break step is used as the scribing method. More specifically, the crack is formed partway on the substrate in the scribing step, and then the break step is executed to end the division of substrate. However, it should be noted that a suitably adoptable scribing method is not limited to this. Besides, it is also possible to adopt another scribing method of forming a crack from the first surface of the substrate to the surface opposed to the first surface of the substrate so as to omit a subsequent break step.

Subsequently, a method of manufacturing the image display device by using the device acquired through the above-scribed steps will be described.

Figure 11:
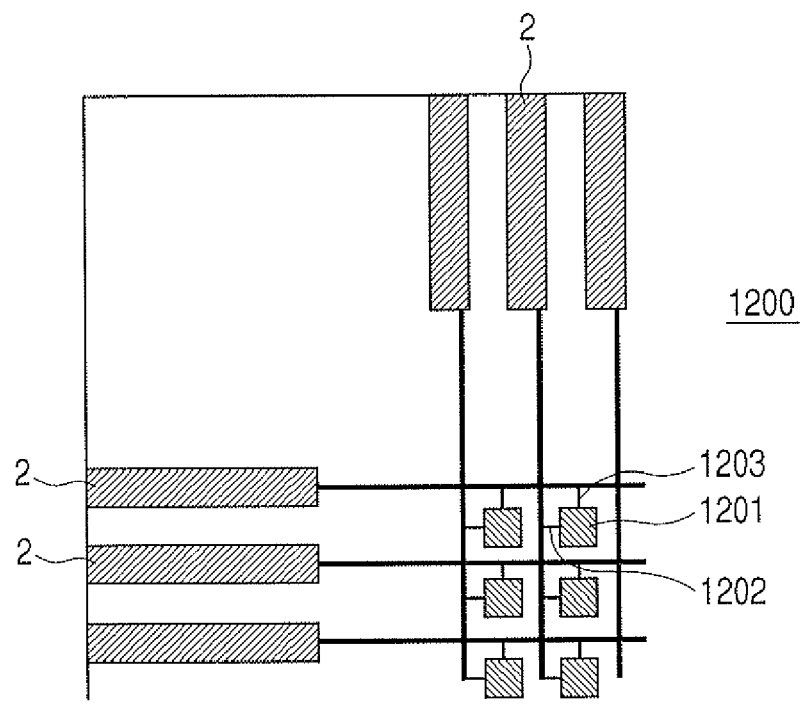
FIG. 11 is a plan view schematically illustrating the constitution of a device after dividing.

FIG. 11 is a plan view schematically illustrating the constitution of a device 1200 which is acquired by separating unnecessary portions by using the device dividing step as described above. Here, it should be noted that the separated unnecessary portions can be used as the parts of another image display device.

In FIG. 11, the three wirings 2 extending from side to side act as scanning wirings, and the three wirings 2 extending up and down act as the modulation wirings. Here, it should be noted that the scanning wirings and the modulation wirings are mutually insulated by insulating layers.

Before the division is executed, electron emission elements 1201 respectively constituting image display elements are formed on the device illustrated in FIG. 11. Here, each of the electron emission elements 1201 acts as a surface-conduction electron emitter which includes an electrode 1202 connected to the modulation wiring, an electrode 1203 connected to the scanning wiring, and an electron emission unit provided between the electrons 1202 and 1203.

Figure 12:
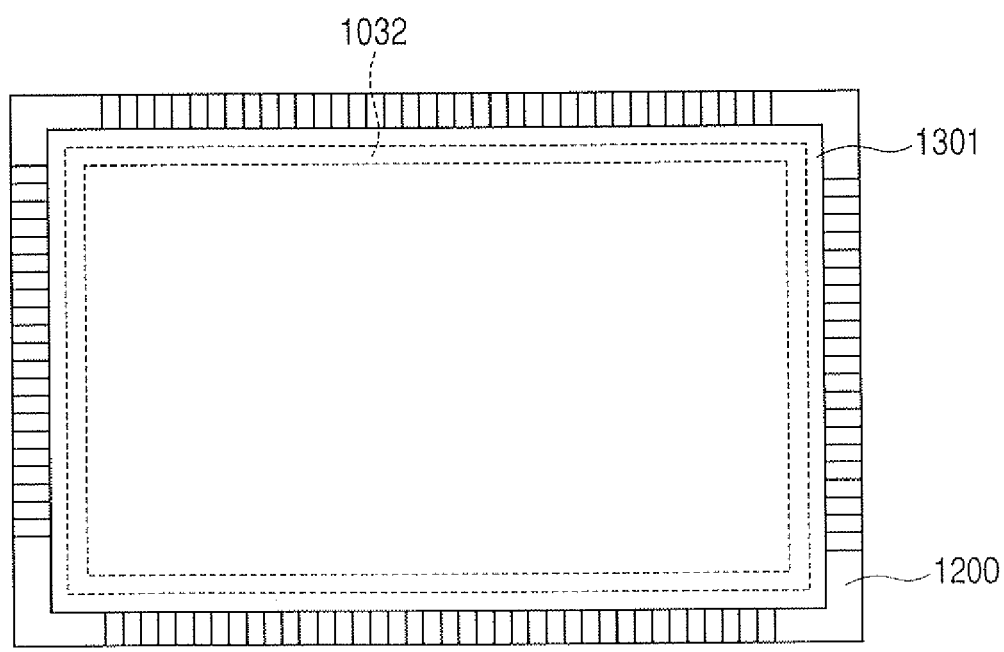
FIG. 12 is a plan view illustrating the constitution of an image display device.

FIG. 12 is a plan view illustrating the constitution of the image display device manufactured by the manufacturing method according to this example.

In FIG. 12, a fluorescent member for emitting light in response to irradiation of electrons from the electron emission element is formed on a face plate 1301 which is disposed opposed to the device 1200 illustrated in FIG. 11.

Figure 13:
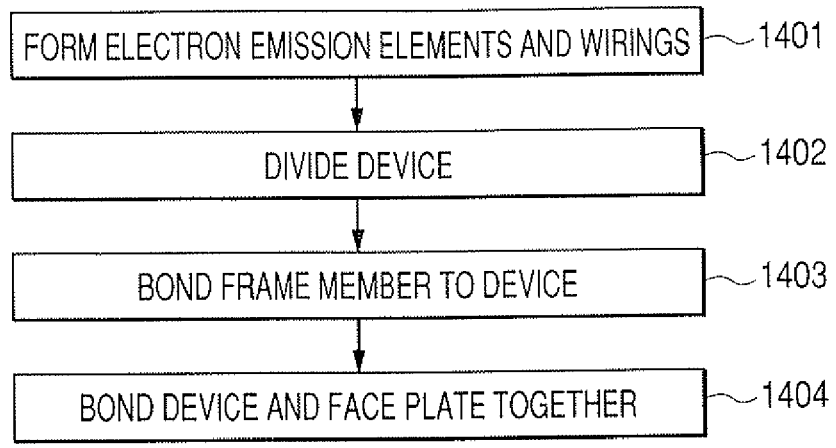
FIG. 13 is a flow chart for describing a method of manufacturing the image display device.

Further, a square frame member 1302 is disposed between the device 1200 and the face plate 1301. In FIG. 12, the image display device is illustrated from the point of view on the side of the face plate 1301, and the frame member 1302 disposed between the face plate 1301 and the device 1200 is illustrated by the dotted lines. FIG. 13 is a flow chart for describing the method of manufacturing the image display device according to this example.

As illustrated in FIG. 13, in a step 1401, the element electrodes, the wirings and the electron emission unit are first formed on a glass substrate, whereby the device which is to be divided is formed. Next, in a step 1402, unnecessary portions are divided and separated from the device formed in the step 1401, by the above-described dividing steps.

Subsequently, in a step 1403, the frame member 1302 is bonded to the divided device by using an adhesion bond or the like. Then, in a step 1404, the face plate 1301 is bonded to the device, whereby the image display device in which the divided device is used is manufactured.

The present invention can be applied to a liquid crystal display, a plasma display and an electroluminescent display.

When a liquid crystal display is applied to, for example, a TFT (thin film transistor) for an active matrix drive corresponds to the image display element.

SECOND EXAMPLE

FIGS. 10A to 10E are schematic diagrams for further describing another example. Incidentally, in the above-described examples, the shearing force for sharing the wiring is applied in the thickness direction of the wiring, but the present invention is not limited to this. In the following, the second example will be described.

Figure 10A:
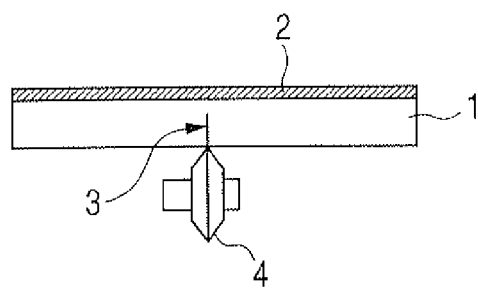
FIGS. 10A, 10B, 10C, 10D and 10E are schematic diagrams for describing a step of, after dividing a substrate, cutting each wiring constituting a wiring pattern by using a cutter knife.
Figure 10B:
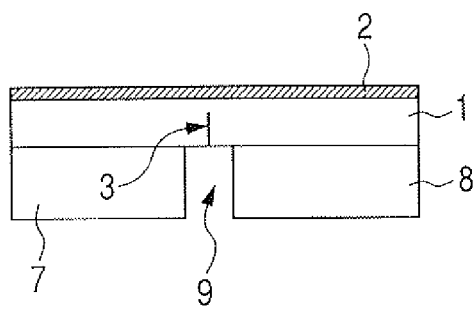
Figure 10C:
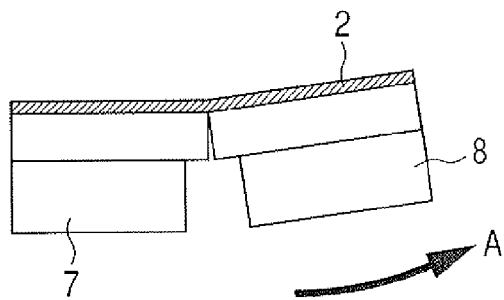
Figure 10D:
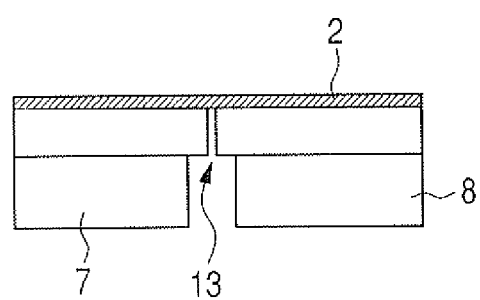
Figure 10E:
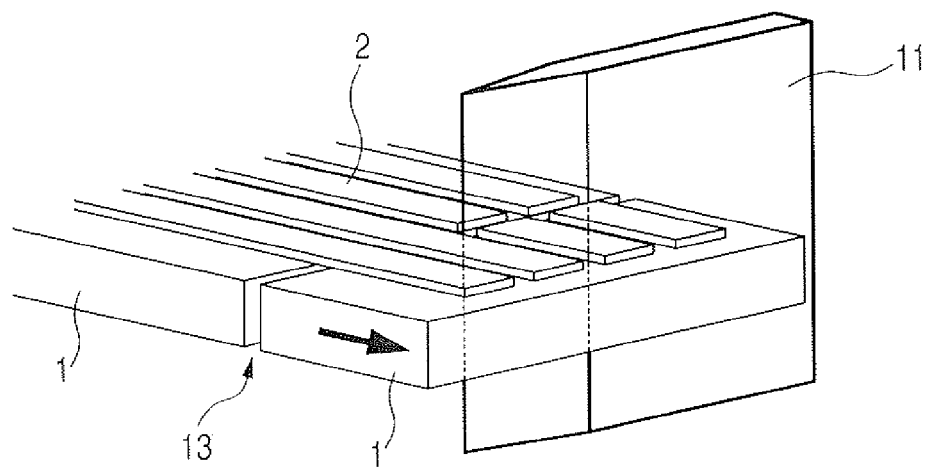

In the second example, as well as in the example illustrated in FIGS. 1A to 1G, the substrate is divided in the steps illustrated in FIGS. 10A to 10C. Thus, the substrate 1 is fixed respectively to the rear surface fixing platforms A 7 and B 8 by a vacuum adsorption method or a mechanical method, as nipping the division position. Then, in the step illustrated in FIG. 10D, the edge surfaces of the divided substrates 1 are slightly separated from each other. Subsequently, in the step illustrated in FIG. 10E, the edge of a cutter knife 11 is inserted into an interval 13 formed in the step of FIG. 10C, from one peripheral end side of the substrate 1 along the divided surface of the substrate 1. Thus, the respective wirings 2 are sequentially divided from one end side to the other end side of the scribe line. As a result of this step, the pressure mechanism including the pressure plate 5 for pressing the wiring 2 on the substrate 1 can be simplified.

In the above-described examples, the step of dividing the wiring is executed in the state that the interval between the divided portions of the respective divided substrates 1 are controlled. In other words, by controlling the interval between the divided edge surfaces of the substrates 1, it is possible to restrain the force of detaching the wiring from the substrate from being applied between the wiring 2 and the substrate 1.

Further, in the above-described examples, the pressure plate 5, the rear surface fixing platform A 7 and the rear surface fixing platform B 8 are used as jigs for the step of dividing the wiring 2. Furthermore, the pressure plate 5, the rear surface fixing platform A 7 and the rear surface fixing platform B 8 are also used as jigs for the step of dividing the substrate 1.

Before the jigs such as the pressure plate 5, the rear surface fixing platform A 7 and the rear surface fixing platform B 8 to be used for the step of dividing the substrate 1 are removed, the step of dividing the wiring 2 is executed. This is effective to restrain the wiring 2 from being detached from the substrate 1.

THIRD EXAMPLE

In the first example and the second example, the wiring is sheared in case of dividing the device. However, the present invention is not limited to this. More specifically, it is possible to eliminate the wiring at the position where the device is to be divided. Here, it should be noted that, as a method of eliminating the wiring, it is possible to adopt a well known wet etching method or a well known dry etching method.

In this method, the wiring which is positioned in the region including the portion where a crack is formed on the substrate in the following step is first eliminated by wet etching or dry etching.

After that, the process of dividing the substrate then executed. More specifically, the crack may be formed on the substrate suitably as well as in the first and second examples. Here, it should be noted that the crack is formed in the region from which the wiring has been eliminated.

Subsequently, the break step is executed according to necessity, and the division of the device ends.

Incidentally, a part of the wiring is eliminated in the third example. However, it is also possible to decrease the thickness of a part of the wiring. That is, by decreasing the thickness of the wiring, it is possible in the subsequent step of dividing the substrate to divide the wiring of which the thickness has been decreased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-145174, filed May 25, 2006, and 2007-128246, filed May 14, 2007, which are hereby incorporated by reference herein in their entirety.

What is claimed is:

1. A method of manufacturing an image display device, said method comprising the steps of:
   forming a wiring and a display element connected to the wiring on a substrate;
   cracking the substrate from a reverse side of a side on which the wiring is formed; and
   shearing the wiring after the step of cracking the substrate has been performed.

2. A method of manufacturing an image display device according to claim 1, wherein the step of cracking the substrate includes a step of irradiating a laser beam on the substrate.

3. A method of manufacturing an image display device according to claim 1, wherein the step of shearing the wiring includes a step of applying, to the wiring, force having a component in a thickness direction of the substrate.

4. A method of manufacturing an image display device according to claim 1, wherein the substrate is a glass substrate.

5. A method of manufacturing an image display device according to claim 1, wherein the wiring is formed by plating.

6. A method of manufacturing an image display device according to claim 1, wherein the wiring is formed by sputtering.

7. A method of manufacturing an image display device according to claim 1, wherein a thickness of the wiring is 1 μm or more.

8. A method of manufacturing an image display device according to claim 1, wherein the wiring includes any one of Cu, Al, Au, Ag, Pt, Cr, Ni, and Pd.

* * * * *